United States Patent
Yeh et al.

(10) Patent No.: US 10,998,285 B2
(45) Date of Patent: May 4, 2021

(54) CODE PATTERN FOR REPRESENTING TRACING NUMBER OF CHIP

(71) Applicant: OmniVision Technologies, Inc., Santa Clara, CA (US)

(72) Inventors: Chien-Chan Yeh, Changhua (TW); Ying-Chih Kuo, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 86 days.

(21) Appl. No.: 16/257,136

(22) Filed: Jan. 25, 2019

(65) Prior Publication Data
US 2020/0243472 A1    Jul. 30, 2020

(51) Int. Cl.
| | |
|---|---|
| *H01L 21/78* | (2006.01) |
| *H01L 23/00* | (2006.01) |
| *H01L 23/31* | (2006.01) |
| *H01L 23/544* | (2006.01) |

(52) U.S. Cl.
CPC .......... *H01L 24/32* (2013.01); *H01L 23/3114* (2013.01); *H01L 23/544* (2013.01); *H01L 2223/54433* (2013.01)

(58) Field of Classification Search
None
See application file for complete search history.

(56) References Cited

U.S. PATENT DOCUMENTS

| | | | |
|---|---|---|---|
| 5,175,774 A | 12/1992 | Truax et al. | |
| 6,584,371 B1 | 6/2003 | Sada et al. | |
| 7,451,010 B2 | 11/2008 | Lee et al. | |
| 2005/0023246 A1* | 2/2005 | McEntee | B24B 1/04 216/83 |
| 2012/0292744 A1* | 11/2012 | Liu | H01L 23/544 257/620 |
| 2013/0093036 A1* | 4/2013 | Huang | H01L 31/0232 257/432 |
| 2018/0114702 A1* | 4/2018 | Kodani | H01L 23/49822 |

OTHER PUBLICATIONS

Y. Kokushi, Y. Saitou, A. Mori, Micro ID marking for semiconductor chips: recent progress and future prospects, Proc. SPIE 7202, SPIE Feb. 24, 2009.

* cited by examiner

*Primary Examiner* — Joseph C. Nicely
*Assistant Examiner* — Lamont B Koo

(57) ABSTRACT

A chip comprises a semiconductor substrate having a first side and a second side opposite to the first side, a plurality of conductive metal patterns formed on the first side of the semiconductor substrate, a plurality of solder balls formed on the first side of the semiconductor substrate, and at least one code pattern of a first group and at least one code pattern of a second group formed on the first side of the semiconductor substrate in a space free from the plurality of conductive metal patterns and the plurality of solder balls, wherein the code patterns are visible from a backside of the chip, and wherein a tracing number of the chip is represented by the code patterns.

15 Claims, 9 Drawing Sheets

| Code | Code Pattern |
|---|---|
| 0 | |
| 1 |  |
| 2 |  |
| 3 |  |
| 4 |  |

201
202
203
204

| Code | Code Pattern | | |
|---|---|---|---|
| 5 |  | 205a | 205b |
| 6 |  | | |
| 7 |  | | |
| 8 |  | | |
| 9 |  | | |

206
207
208
209

| | Code Pattern |
|---|---|
| 1 |  301 |
| 2 |  302 |
| 3 |  303 |
| 4 |  304 |
| 5 |  305 |
| 6 |  306 |

| | Code Pattern |
|---|---|
| 7 |  307 |
| 8 |  308 |
| 9 |  309 |
| 10 |  310 |
| 11 |  311 |
| 12 |  312 |

| | Code Pattern |
|---|---|
| 13 | V | 313
| 14 | ⌵ | 314
| 15 | L | 315
| 16 | ⌊ | 316
| 17 | \ | 317
| 18 | \| | 318

| | Code Pattern |
|---|---|
| 19 | ) | 319
| 20 | ⌋ | 320
| 21 | ⌐ | 321
| 22 | ⌵ | 322
| 23 | V | 323
| 24 | \| | 324

Fig. 4

CODE PATTERN FOR REPRESENTING TRACING NUMBER OF CHIP

FIELD OF THE INVENTION

This invention relates to a code pattern for representing the tracing number of a chip, and more specifically relates to a code pattern formed on a semiconductor substrate in a space free from conductive metal patterns and solder balls of a chip for representing the tracing number of the chip.

BACKGROUND OF THE INVENTION

It is a common practice to laser mark a tracing number on a chip to trace its manufacturing history. The tracing number may include a lot ID (identification), a wafer number, and a coordinate of the chip in the wafer. For example, the lot ID may be "P51841X". A lot may consist of 25 wafers, thus the wafer number may be "15". The chip may located at a coordinate of (100,100), thus the coordinate may be 100100. Thus, the tracing number of the chip may be "P51841X15100100". The tracing number "P51841X15100100" is marked using laser on the bottom of the chip.

The tracing number is important because if the defects of a chip come to light, then other chips from the same lot may be traced for taking any necessary action. This is especially important for chips used in medical applications.

As the chip becomes smaller, for example, its bottom surface area may be 575 µm×575 µm or less than 1 mm×1 mm, it becomes harder to allocate space for the laser marking. The bottom of the chip is also normally occupied by solder balls. Each ball may have a diameter approximately 150 µm.

Accordingly, small chips with cross-section less than 1 mm×1 mm having tracing number marked on the bottom of the chip, which may not be based on laser marking, are demanded.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3, FIG. 4, and FIG. 5 illustrate a second group of exemplary code patterns to represent wafer number 1 to 25, respectively, according to an embodiment of the present invention.

Figure 1:
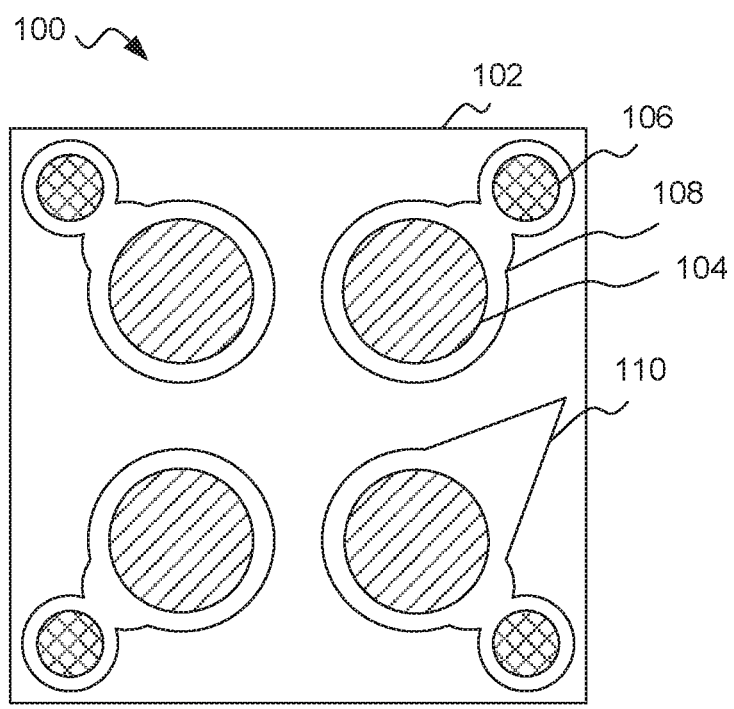
FIG. 1 illustrates an exemplary bottom of a chip viewed from the backside of the chip, according to an embodiment of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION in the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

FIG. 1 illustrates an exemplary bottom of a chip 100 viewed from the backside of the chip, according to an embodiment of the present invention. Chip 100 comprises a semiconductor substrate 102 having a first side and a second side opposite to the first side. The first side of semiconductor substrate 102 is viewed as the bottom of chip 100 from the backside of the chip. A plurality, for example, four solder balls 104 of a BGA (ball grid array) are formed on the first side of semiconductor substrate 102. A plurality, for example, four TSVs (through-silicon via) 106 are formed to connect the first side and the second side of semiconductor substrate 102. A plurality, for example, four conductive metal patterns 108 are formed on the first side of semiconductor substrate 102. At least one of plurality of conductive metal patterns 108 is electrically coupled to at least one of solder ball 104. A conductive metal pattern 108 comprises a Pin-1-Mark 110 for indicating the orientation of the bottom of chip 100.

For example, the first side of semiconductor substrate 102 has an area of 575×575 µm, or less than 1 mm×1 mm. There is no space to laser mark any tracing number such as "P51841X15100100" on semiconductor substrate 102.

To minimize the space required for marking tracing number, the tracing number (e.g., P51841X15100100) is decomposed into the lot ID (e.g., P51841X), the wafer number (e.g., 15), and the chip coordinate (e.g., 100100). Since the space is limited, the chip coordinate may be omitted. Only the ID lot and the wafer number are marked on the first side of semiconductor substrate 102 at different location since they have been decomposed. Furthermore, the lot ID and the wafer number are represented by specific code patterns.

Figure 2:
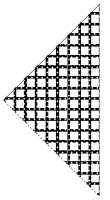
FIG. 2 illustrates a first group of exemplary code patterns to represent codes of single digit "0"-"9", respectively, according to an embodiment of the present invention.
Figure 2:
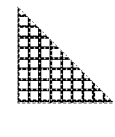
Figure 2:
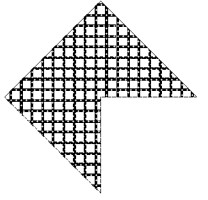
Figure 2:
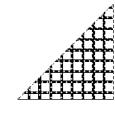
Figure 2:
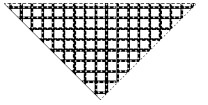
Figure 2:
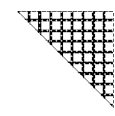
Figure 2:
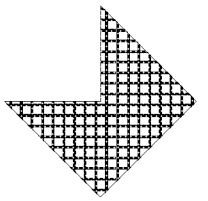
Figure 2:
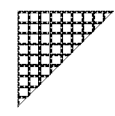
Figure 2:
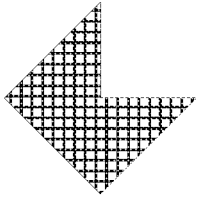

For example, a lot ID "AS00807.01" may be coded by the last single digit "7", a lot ID "P7F679" may be coded by the last single digit "9". These codes, e.g., "0"-"9", of single digit are further represented by a first group of code patterns as shown in FIG. 2. In an embodiment, a type of chip has only a limited number of lot IDs available. Thus the codes of single digit may be sufficient to retrieve the lot ID. In another embodiment, a code consisting of more than one digits may be necessary.

FIG. 2 illustrates the first group of exemplary code patterns 201-209 to represent codes of single digit "1"-"9", respectively, according to an embodiment of the present invention. Code 0 is represented by no pattern. Code 1 is represented by code pattern 201. Code 2 is represented by code pattern 202. Code 3 is represented by code pattern 203. Code 4 is represented by code pattern 204. Code 5 is represented by code pattern 205a or 205b. Code 6 is represented by code pattern 206. Code 7 is represented by code pattern 207. Code 8 is represented by code pattern 208. Code 9 is represented by code pattern 209.

Figure 3:
Figure 3:
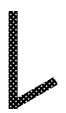
Figure 3:
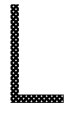
Figure 3:
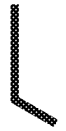
Figure 3:
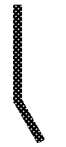
Figure 3:
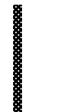
Figure 3:
Figure 3:
Figure 3:
Figure 3:
Figure 3:
Figure 3:
Figure 5:
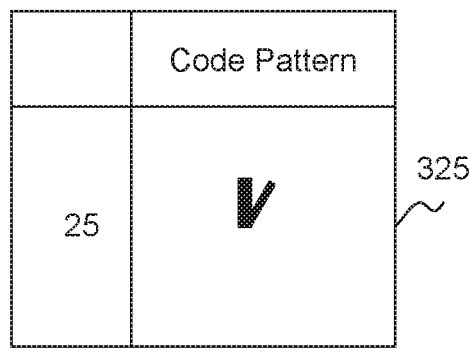

Wafer number is typically number 1 to 25. FIGS. 3-5 illustrate a second group of exemplary code patterns 301-325 to represent wafer number 1 to 25, respectively, according to an embodiment of the present invention. Wafer number 1 is represented by code pattern 301. Wafer number 2 is represented by code pattern 302. Wafer number 3 is represented by code pattern 303. Wafer number 4 is represented by code pattern 304. Wafer number 5 is represented by code pattern 305. Wafer number 6 is represented by code pattern 306. Wafer number 7 is represented by code pattern 307. Wafer number 8 is represented by code pattern 308. Wafer number 9 is represented by code pattern 309. Wafer number 10 is represented by code pattern 310. Wafer number 11 is represented by code pattern 311. Wafer number 12 is represented by code pattern 312. Wafer number 13 is represented by code pattern 313. Wafer number 14 is represented by code pattern 314. Wafer number 15 is represented by code pattern 315. Wafer number 16 is represented by code pattern 316. Wafer number 17 is represented by code pattern 317. Wafer number 18 is represented by code pattern 318. Wafer number 19 is represented by code pattern 319. Wafer number 20 is represented by code pattern 320. Wafer number 21 is represented by code pattern 321. Wafer number 22 is represented by code pattern 322. Wafer number 23 is represented by code pattern 323. Wafer number 24 is represented by code pattern 324. Wafer number 25 is represented by code pattern 325.

For example, wafer numbers 1-11 are represented by clock faces showing 1 o'clock to 11 o'clock comprising long minute hand and short hour hand having the same thickness, respectively. Wafer numbers 12-23 are represented by clock faces showing 12 o'clock to 11 o'clock comprising minute hand as long as hour hand having the same thickness, respectively. Wafer numbers 24-25 are represented by clock faces showing 12 o'clock and 1 o'clock comprising minute hand as long as hour hand, and minute hand thicker than hour hand, respectively.

Figure 6:
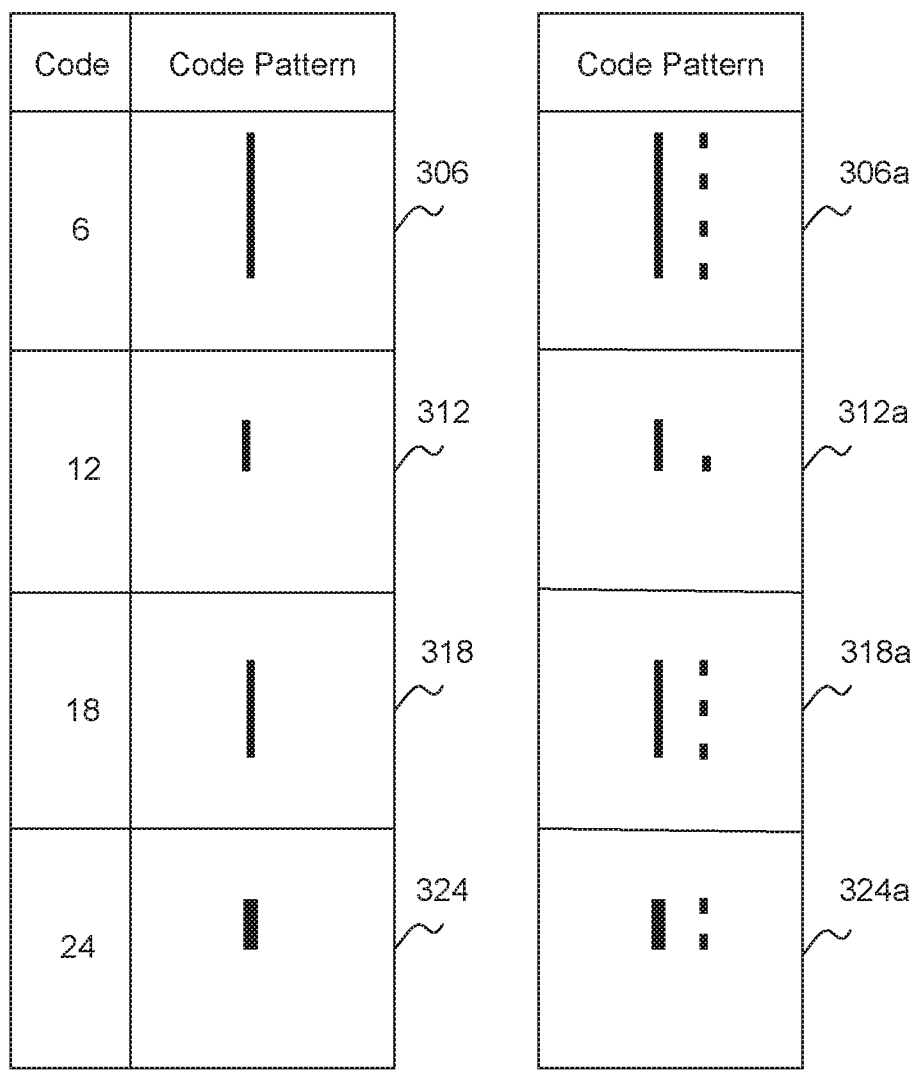
FIG. 6 illustrates exemplary code patterns modified to have additional dot patterns, according to an embodiment of the present invention.

To eliminate the similarity among code patterns 306 (wafer number 6), code patterns 312 (wafer number 12), code patterns 318 (wafer number 18), and code patterns 324 (wafer number 24), additional dot patterns may be added to respective code patterns 306, 312, 318, and 324. FIG. 6 illustrates that code pattern 306 is modified to a code pattern 306a having four additional dots, code pattern 312 is modified to code pattern 312a having one additional dot, code pattern 318 is modified to code pattern 3186a having three additional dots, and code pattern 324 is modified to code pattern 324a having two additional dots, according to an embodiment of the present invention.

Figure 7:
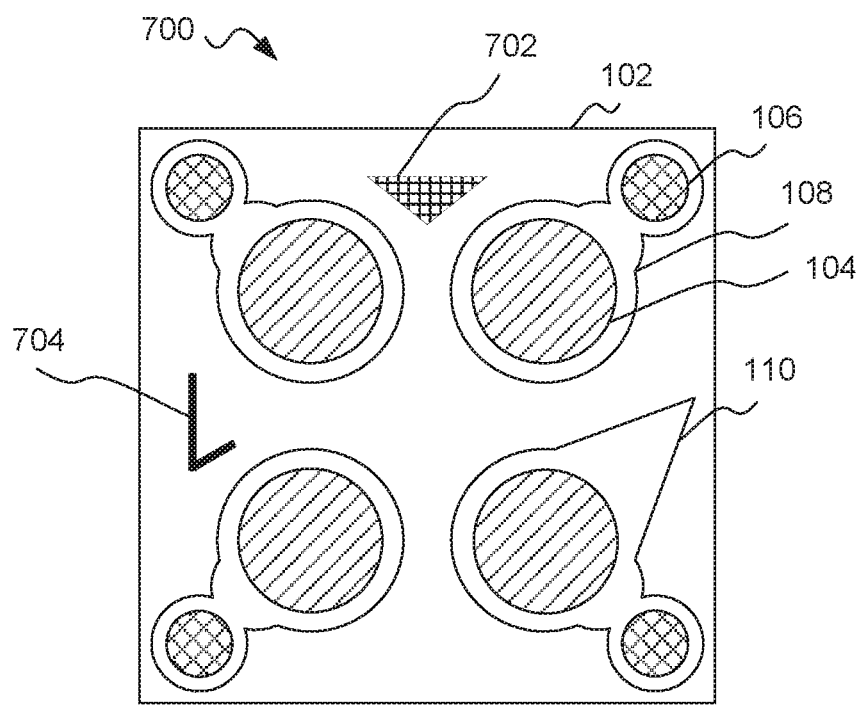
FIG. 7 illustrates an exemplary bottom of a chip viewed from the backside of the chip, according to an embodiment of the present invention.

FIG. 7 illustrates an exemplary bottom of a chip 700 viewed from the backside of the chip, according to an embodiment of the present invention. A code pattern 702 of the first group for lot ID and a code pattern 704 of the second group for wafer number are formed on the first side of semiconductor substrate 102 in a space free from four conductive metal patterns 108. To correctly recognize the code patterns, semiconductor substrate 102 is properly oriented referring to the position of Pin-1-Mark 110. For example, code pattern 702 refers to the lot ID "7", and code pattern 704 refers to the wafer number "2". The lot ID code "7" may retrieve that the lot ID is "AS00807.01", and the wafer number is 2.

For example, the area of semiconductor substrate 102 is 575 µm×575 µm or less than 1 mm×1 mm, thus the space on the first side of the semiconductor substrate 102 free from four conductive metal patterns 108 is very limited. To fit the code patterns in the space, for example, the size of each code pattern may be less than 120 µm×120 µm.

Figure 8:
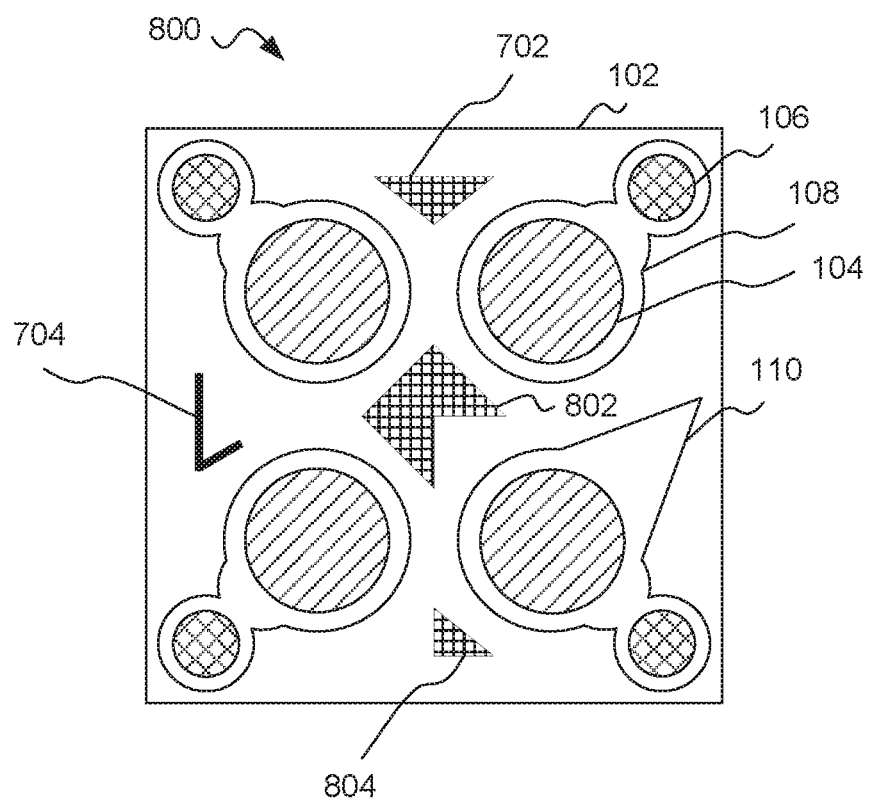
FIG. 8 illustrates an exemplary bottom of a chip viewed from the backside of the chip, according to an embodiment of the present invention.

FIG. 8 illustrates an exemplary bottom of a chip 800 viewed from the backside of the chip, according to an embodiment of the present invention. A code pattern 702 of the first group for lot ID and a code pattern 704 of the second group for wafer number are formed on the first side of the semiconductor substrate 102 in a space free from four conductive metal patterns 108. In addition, a code pattern 802 of the first group for lot ID and a code pattern 804 of the first group for lot ID are also formed on the first side of the semiconductor substrate 102 in a space free from four conductive metal patterns 108. For example, code pattern 802 refers to the code "6", and code pattern 804 refers to the code "1". To correctly recognize the code patterns and the order of codes, semiconductor substrate 102 is properly oriented referring to the position of Pin-1-Mark 110. For example, the code patterns of the first group may represent a code of "761" and it may retrieve the lot ID "P7F761". Code pattern 704 of the second group retrieves that wafer number is "2".

It is appreciated that the rule of coding lot ID may be freely defined. Thus, one may use the last digit of the lot ID as the code, or other digits in the lot ID as the code. Thus codes for lot ID may be one digit or may be more than one digits. Each code may be represented by any patterns or designs, it is not limited to FIG. 2. Similarly, wafer numbers may be represented by any patterns or designs not limited to FIGS. 3-5. Furthermore, the tracing number may include product version, year, month, and other necessary data and information. Any component of the tracing number may be encoded into a code pattern and marked on the bottom of the chip.

Figure 9:
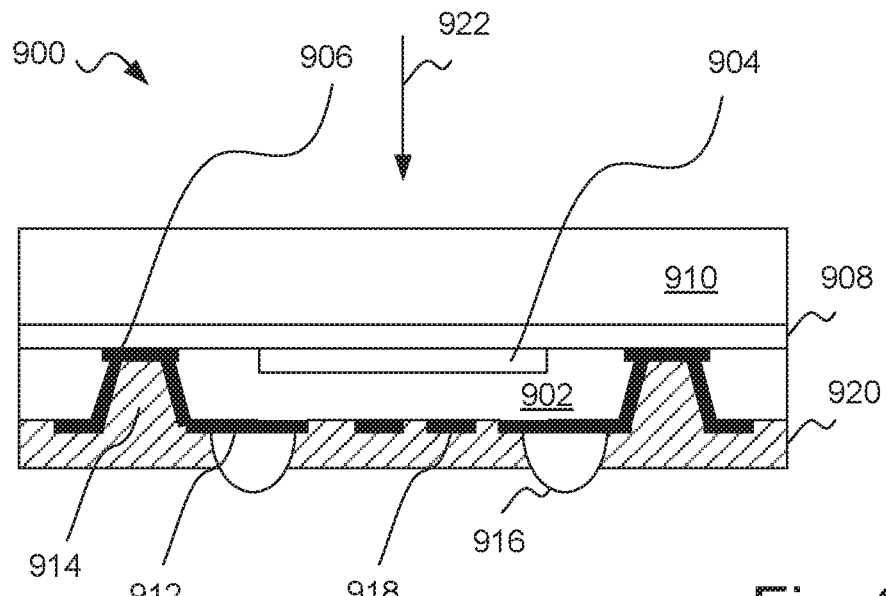
FIG. 9 illustrates an exemplary chip, according to an embodiment of the present invention.

FIG. 9 illustrates an exemplary chip 900, according to an embodiment of the present invention. Chip 900 comprises a semiconductor substrate 902 having a first side and a second side opposite to the first side. An image sensor 904 is formed on the second side of semiconductor substrate 902. A plurality of bonding pads 906 are also formed on the second side of semiconductor substrate 902 electrically coupled to image sensor 904. A bonding epoxy layer 908 is disposed over the second side of semiconductor substrate 902 covering image sensor 904 and the plurality of bonding pads 906. A cover glass 910 is disposed on bonding epoxy layer 908. An incident light 922 forms an image on image sensor 902.

Figure 10:
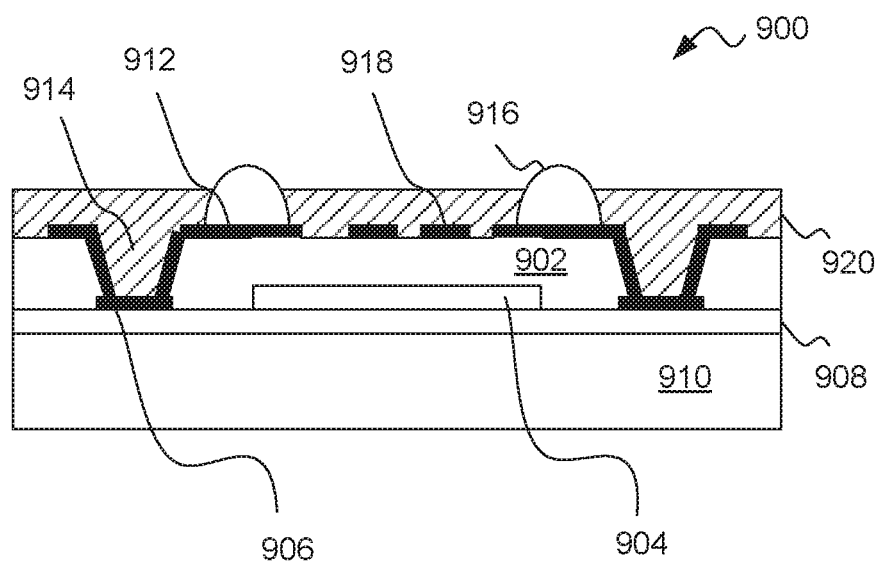
FIG. 10 illustrates chip in FIG. 9 in a reversed (up-side-down) position, according to an embodiment of the present invention.

FIG. 10 illustrates chip 900 in a reversed (up-side-down) position relative to FIG. 9, according to an embodiment of the present invention. In this position, a plurality of conductive metal patterns 912 and a plurality of solder balls 916 are formed on the first side of semiconductor substrate 902.

A plurality of TSVs 914 are formed to connect the first side and the second side of semiconductor substrate 902. At least one of plurality of conductive metal patterns 912 is electrically coupled to at least one of plurality of solder balls 916 and at least one of plurality of bonding pad 906 through a TSV of plurality of TSVs 914.

For example, code patterns 918, comprising at least code patterns 702 and 704 of FIG. 7, are formed at the same time when conductive metal patterns 912 are formed, and using the same material as conductive metal patterns 912. Code patterns 918 are electrically isolated from plurality of conductive metal patterns 912. Code patterns 918 may be formed by RDL (redistribution layer) process using photolithography.

It is possible that one code patterns 918 are not formed at the same time when plurality conductive metal patterns 912 are formed, and code patterns 918 are using different materials from plurality of conductive metal patterns 912.

A transparent passivation layer 920 is disposed over the first side of semiconductor substrate 902 covering plurality of conductive metal patterns 912 and code patterns 918. Passivation layer 920 may be SiO2 or any suitable materials. Passivation layer 920 protects the surface covered underneath. Accordingly, code patterns 918 on semiconductor substrate 902 are visible from the backside of chip 900.

Semiconductor substrate 902 of chip 900 is a part of a semiconductor wafer (not shown) before chip 900 is singulated from the semiconductor wafer. The tracing number of chip 900 comprises the tracing number of the semiconductor wafer including lot ID and wafer number.

While the present invention has been described herein with respect to the exemplary embodiments and the best mode for practicing the invention, it will be apparent to one of ordinary skill in the art that many modifications, improvements and sub-combinations of the various embodiments, adaptations and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A chip comprising:
   a semiconductor substrate having a first side and a second side opposite to the first side;
   a plurality of conductive metal patterns formed on the first side of the semiconductor substrate;
   a plurality of solder balls formed on the first side of the semiconductor substrate; and
   at least one code pattern of a first group and at least one code pattern of a second group formed on the first side of the semiconductor substrate in a space free from the plurality of conductive metal patterns and the plurality of solder balls;
   wherein the at least one code pattern of the first group and the at least one code pattern of the second group are visible from a backside of the chip;
   wherein a tracing number of the chip is represented by the at least one code pattern of the first group and the at least one code pattern of the second group; and
   wherein the at least one code pattern of the first group and the at least one code pattern of the second group are formed using the same material as the plurality of conductive metal patterns;
   wherein the sizes of the at least one code pattern of the first group and the at least one code pattern of the second group are less than 120 μm×120 μm.

2. The chip of claim 1, wherein at least one of the plurality of solder balls is electrically coupled to at least one of the plurality of conductive metal patterns.

3. The chip of claim 1 further comprising:
   a transparent passivation layer on the first side of the semiconductor substrate covering the at least one code pattern of the first group and the at least one code pattern of the second group and the plurality of conductive metal patterns.

4. The chip of claim 1, wherein the tracing number of the chip comprises a lot ID (identification), wherein the lot ID is coded by a code, and wherein the code is represented by the at least one code pattern of the first group.

5. The chip of claim 1, wherein the tracing number of the chip comprises a wafer number, and wherein the wafer number is represented by the at least one code pattern of the second group.

6. The chip of claim 1, wherein an area of the semiconductor substrate is less than 1 mm×1 mm.

7. The chip of claim 1 further comprising:
   an image sensor formed on the second side of the semiconductor substrate;
   a plurality of TSVs (through-silicon-vias) connecting the first side and the second side of the semiconductor substrate;
   a plurality of bond pads formed on the second side of the semiconductor substrate, wherein at least one of the plurality of conductive metal patterns is coupled to at least one of the plurality of solder balls and at least one of the plurality of bond pads through a TSV of the plurality of TSVs;
   a bonding epoxy layer disposed on the second side of the semiconductor substrate covering the image sensor and the plurality of bond pads; and
   a cover glass disposed on the bonding epoxy layer.

8. The chip of claim 1, wherein the semiconductor substrate is a part of a semiconductor wafer, and wherein the tracing number of the chip is a tracing number of the semiconductor wafer.

9. A chip comprising:
   a semiconductor substrate having a first side and a second side opposite to the first side;
   a plurality of conductive metal patterns formed on the first side of the semiconductor substrate;
   a plurality of solder balls formed on the first side of the semiconductor substrate; and
   at least one code pattern of a first group and at least one code pattern of a second group formed on the first side of the semiconductor substrate in a space free from the plurality of conductive metal patterns and the plurality of solder balls;
   wherein the at least one code pattern of the first group and the at least one code pattern of the second group are visible from a backside of the chip;
   wherein a tracing number of the chip is represented by the at least one code pattern of the first group and the at least one code pattern of the second group; and wherein the at least one code pattern of the first group and the at least one code pattern of the second group are formed using the same material as the plurality of conductive metal patterns;

wherein the at least one code pattern of the first group and the at least one code pattern of the second group are formed by RDL (redistribution layer) using photolithography.

10. The chip of claim 9, wherein the semiconductor substrate is a part of a semiconductor wafer, and wherein the tracing number of the chip is a tracing number of the semiconductor wafer.

11. A chip comprising:
a semiconductor substrate having a first side and a second side opposite to the first side;
an image sensor formed on the second side of the semiconductor substrate;
a plurality of bond pads formed on the second side of the semiconductor substrate;
a bonding epoxy layer disposed on the second side of the semiconductor substrate covering the image sensor and the plurality of bond pads;
a cover glass disposed on the bonding epoxy layer;
a plurality of TSVs connecting the first side and the second side of the semiconductor substrate;
a plurality of conductive metal patterns formed on the first side of the semiconductor substrate;
a plurality of solder balls formed on the first side of the semiconductor substrate, wherein at least one of the plurality of conductive metal patterns is coupled to at least one of the plurality of solder balls and at least one of the plurality of bond pads through a TSV of the plurality of TSVs;
at least one code pattern of a first group and at least one code pattern of a second group formed on the first side of the semiconductor substrate in a space free from the plurality of conductive metal patterns and the plurality of solder balls;
a transparent passivation layer on the first side of the semiconductor substrate covering the at least one code pattern of the first group and the at least one code pattern of the second group and the plurality of conductive metal patterns;
wherein the at least one code pattern of the first group and the at least one code pattern of the second group at least one code pattern are visible from a backside of the chip; and
wherein a tracing number of the chip is represented by the at least one code pattern of the first group and the at least one code pattern of the second group;
wherein the at least one code pattern of the first group and the at least one code pattern of the second group are formed by RDL (redistribution layer) using photolithography.

12. The chip of claim 11, wherein an area of the semiconductor substrate is less than 1 mm×1 mm.

13. The chip of claim 11, wherein the size of the code pattern is less than 120 μm×120 μm.

14. The chip of claim 11, wherein the at least one code pattern of the first group and the at least one code pattern of the second group are formed using the same material as the plurality of conductive metal patterns.

15. The chip of claim 11, wherein the semiconductor substrate is a part of a semiconductor wafer, and wherein the tracing number of the chip is a tracing number of the semiconductor wafer.

* * * * *